(12) United States Patent
Johnson et al.

(10) Patent No.: US 7,411,168 B2
(45) Date of Patent: Aug. 12, 2008

(54) CMOS IMAGER WITH WIDE DYNAMIC RANGE PIXEL

(75) Inventors: Kim Loren Johnson, Carlsbad, CA (US); Eugene Atlas, Irvine, CA (US); Sarit Neter, Irvine, CA (US)

(73) Assignee: Imagerlaes, Inc., Monrovia, CA (US)

( * ) Notice: Subject to any disclaimer, the term of this patent is extended or adjusted under 35 U.S.C. 154(b) by 471 days.

(21) Appl. No.: 11/311,211

(22) Filed: Dec. 19, 2005

(65) Prior Publication Data

US 2007/0023786 A1 Feb. 1, 2007

Related U.S. Application Data

(60) Provisional application No. 60/703,199, filed on Jul. 28, 2005.

(51) Int. Cl.
*H01L 27/00* (2006.01)

(52) U.S. Cl. ............... 250/208.1; 348/308; 257/292

(58) Field of Classification Search ............ 250/208.1, 250/214.1; 257/290–292; 348/294–297, 348/308
See application file for complete search history.

(56) References Cited

U.S. PATENT DOCUMENTS

| | | | |
|---|---|---|---|
| 5,886,353 A | 3/1999 | Spivey et al. | 250/370.09 |
| 6,587,142 B1 | 7/2003 | Kozlowski et al. | 348/241 |
| 6,943,838 B2 * | 9/2005 | Fossum et al. | 348/311 |
| 2004/0041927 A1 * | 3/2004 | Cho et al. | 348/254 |

FOREIGN PATENT DOCUMENTS

WO  2006/029352  7/2006

* cited by examiner

*Primary Examiner*—Kevin Pyo
(74) *Attorney, Agent, or Firm*—Tom Chen; MacPherson Kwok Chen & Heid, LLP.

(57) ABSTRACT

In one aspect of the present invention, a light sensor is provided in the active pixel sensor cell for sensing incident radiation. The voltage corresponding to the photon-generated or other radiation-generated charge in the active pixel sensor cell is stored on a storage node via a sample-and-hold capacitor. Additional elements, such as source-follower transistors, may reside between the sensing element and the sample-and-hold capacitor. The signal is read via a readout source-follower (RSF) transistor. The readout source-follower drain is connected to the row select switch while its drain is connected to the output node on the column output bus. This configuration couples the storage node to the gate-source capacitance of the readout source-follower transistor. This allows the voltage on the storage node to increase proportionally to the increase in voltage on the readout node when the row select is closed and thus enables the drain current to flow through the RSF to the column output bus.

26 Claims, 6 Drawing Sheets

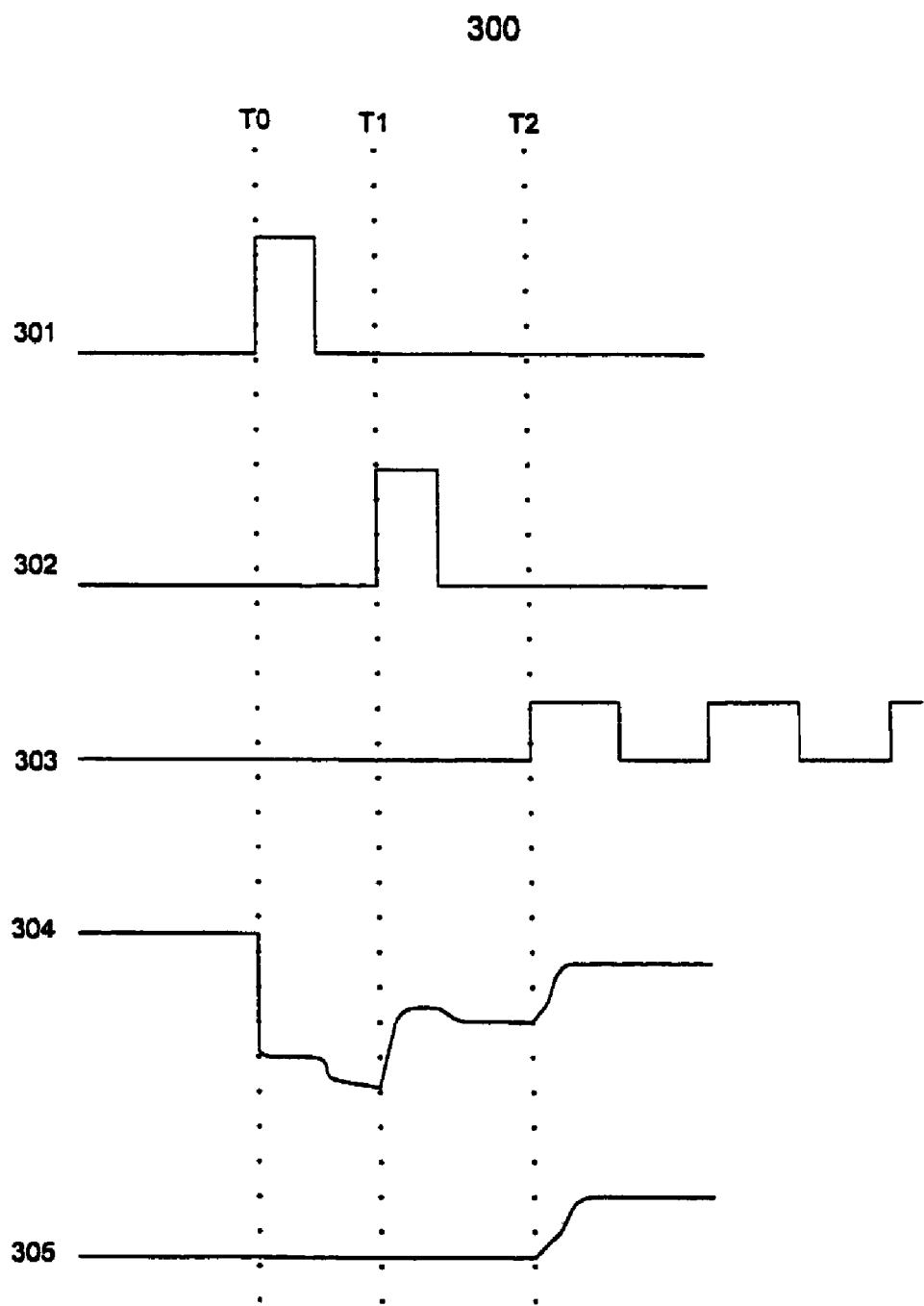

$$\frac{0.8}{1-0.8 \cdot \left[\dfrac{C_{GS-RSF}}{G_{GS-RSF}+C_{PAR}}\right]} \cdot [V_{SIG} - V_{TH-ISF} - V_{TH\_RSF}]$$

CMOS IMAGER WITH WIDE DYNAMIC RANGE PIXEL

RELATED APPLICATION

The present application is based on and claims priority to U.S. Provisional application Ser. No. 60/703,199, filed Jul. 28, 2005.

BACKGROUND

1. Field of the Invention

The present invention relates to the field of semiconductor devices and, in particular, to complementary metal oxide semiconductor (CMOS) image sensors.

2. Related Art

Thanks to the latest advances in technology, CMOS imagers have been used in various applications and have not been limited any more to consumer low-end applications only.

A typical CMOS imager comprises of a focal plane array of pixel cells, each one of the pixels further comprising a light detection component such as a photodiode, a photogate or a photoconductor. The pixel also has a readout circuit that is connected to its light detection node and may also include a sample-and-hold circuit for electronic shutter control either before or after the readout circuit. The CMOS imager pixel cell may include at least one transistor for transferring charge from the charge accumulation region of the substrate to the light detection node that can be a floating diffusion node and also has a transistor for resetting the light detection node to a predetermined charge level prior to charge transfer.

A widely-used Active Pixel Sensor (APS) is the 4-Transistor (4T) design which comprises of a photodiode that is typically reversed-biased, a sample-and-hold (SH) transistor which provides snap shot control connected to the light detection node, a reset transistor, a source-follower (SF) transistor which has a gate acting as signal storage for the sample-and-hold transistor SH and as the signal buffer amp, and a select transistor that connects the pixel to the column bus and allows the signal transfer from the pixel to the column amplifier. An APS is depicted in FIG. 1.

FIG. 1 depicts the widely used prior art Active Pixel Sensor of 4T (4 Transistors) design typically (but not always) realized with N-Type transistors. A CMOS imager comprises of array of pixels 100, one of which is shown here. The pixel 100 includes a reversed-biased photodiode 101 overlying a doped region of a substrate for accumulating photo-generated charge during the integration period. The photodiode 101 is reset to a predefined charge level prior to integration via a reset switch, such as a transistor 102 which is controlled by a reset clock signal 110 at its gate. A sample-and-hold transfer switch, such as a transistor 103, provides means of transferring the charge from the collection region and providing a corresponding voltage level on the gate of a source-follower transistor 104. A select transistor 105, which is controlled by a select clock 108 signal, outputs the signal corresponding to the photon-generated charge on to a column bus 107.

The reset transistor 102 resets the photodiode to a high level based on a process positive supply voltage VDD 106 that is connected to its drain and the reset clock 110 positive voltage that is usually limited to the fabrication process positive voltage VDD. Hence in this example, after the photodiode is reset to a level that is below VDD based on the threshold voltage, it will integrate down during the integration period. The voltage drifts with temperature changes, and thus the amount of loss in the dynamic range available for the photodiode integration drifts as well.

The source-follower 104 as explained previously receives on its gate the voltage level corresponding to the signal, while its drain is connected to VDD 106. Its threshold also drifts with temperature changes and thus the amount of loss in the dynamic range of the source-follower 104 also drifts.

It can be seen that for the pixel 100, the linear voltage range is limited to output voltage $V_{OUT}$ as follows:

$V_{OUT}$=VDD—Voltage threshold of reset transistor 102—Voltage threshold of source follower transistor 104—Saturation Voltage (drain-to-source voltage) of select transistor 105.

For a typical 3.3V CMOS process, this range may be as low as 1 Volt.

The pixel 100 suffers from a condition known as "image lag", where an incomplete charge transfer occurs through the sample-and-hold transistor 103 due to imperfect sampling of the signal. This results in non-linear operation of the sensor, especially at low signal levels, and increased noise.

The pixel 100 further suffers from reduced gain, because the integrated charge is divided between an integration node 111 and the gate of the source-follower transistor 104, thus reducing the sensitivity of the imager.

In addition, pixel 100 suffers from increased noise and non-linearity due to un-cleared output voltage of previous integration prior to transferring voltage representing the newly integrated charge (also referred to as "image ghost"). The result of the various losses described here is a drifting reduction in the total dynamic range of the output signal that can not be recovered off chip.

Furthermore, the pixel 100 suffers from decreased dynamic range due to clipping of the signal high range or the signal low range depending on the polarity of the photo-diode and the circuitry. The signal clipping is caused by the threshold voltage drop and temperature dependent drift of the various transistors.

Accordingly, it is desirable to have an active pixel sensor or circuit for use in CMOS imagers without the disadvantages of conventional circuits discussed above.

SUMMARY

According to one aspect of the present invention, an active pixel sensor has a wide dynamic range through automatic voltage swing recovery for the output source follower. An active pixel sensor cell array may be implemented with minimum additional circuitry and without significantly increasing the pixel cell size. In one embodiment, an active pixel sensor cell in an active pixel sensor array improves performance by simultaneously recovering dynamic range losses, providing signal gain in the pixel, reducing fixed pattern noise (FPN), improving array uniformity, and eliminating previous signal noise known as "ghost image".

In one aspect of the present invention, a radiation sensitive element, such as a photodiode, is provided in the active pixel sensor cell for sensing incident radiation that may be, but not limited to, visible light spectrum, long wavelength spectrum such as Infrared (IR), shortwave spectrum such as Ultraviolet (UV), high energy particles, and X-rays. The voltage corresponding to the photon-generated or other radiation-generated charge in the active pixel sensor cell is stored on a storage node via a sample-and-hold capacitor. The sample-and-hold capacitor may be of a parallel plate type, a MOS type, or a junction. Additional elements, such as source-follower transistors, may reside between the sensing element and the sample-and-hold capacitor. The signal is read via a readout source-follower (RSF) transistor. The readout source-follower drain is connected to the row select switch while its drain is connected to the output node on the column output bus. This configuration couples the storage node to the gate-source capacitance of the readout source-follower transistor. This allows the voltage on the storage node to increase proportionally to the increase in voltage on the readout node when the row select is closed and thus enables the drain current to flow through the RSF to the column output bus.

The active pixel sensor cell may be part of an array of active pixels array that further comprises timing circuitry for controlling reset, sampling and other operations, amplification blocks, and so on.

These and other features and advantages of the present invention will be more readily apparent from the detailed description of the preferred embodiments set forth below taken in conjunction with the accompanying drawings.

BRIEF DESCRIPTION OF THE FIGURES

FIG. 3A provides a partial timing and signal diagram for the operation of the pixel depicted in FIG. 2 in accordance with one embodiment of the current invention.

Like element numbers in different figures represent the same or similar elements.

DETAILED DESCRIPTION

Figure 2:
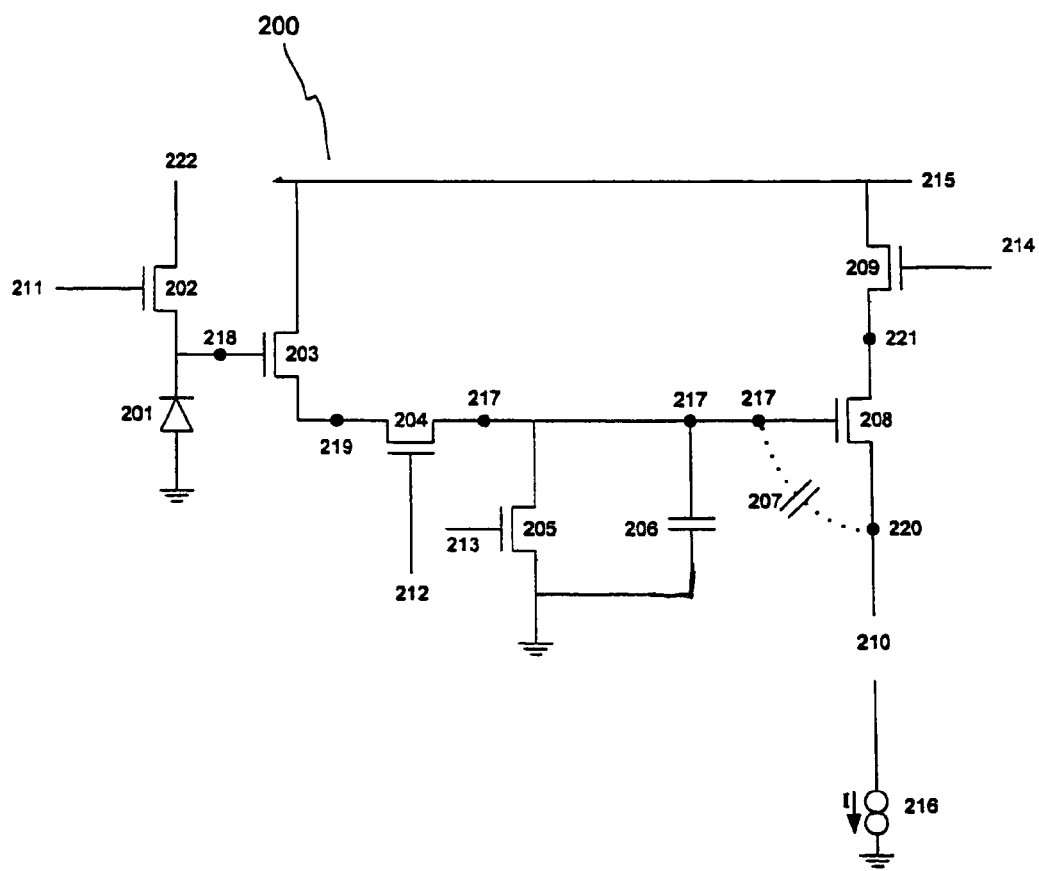
FIG. 2 is a schematic diagram of a portion of a CMOS active pixel sensor array that comprises one active pixel sensor cell in accordance with one embodiment of the current invention.

FIG. 2 is a schematic diagram of a portion of a CMOS active pixel sensor array that comprises an active pixel sensor cell 200 in accordance with one embodiment of the current invention. The cell 200 may be connected to additional cells contained in the array via a column output bus 210 having a current source 216 coupled to ground. The cell (or "pixel") 200 comprises a light sensing device 201 that is not limited to, but in this case is, a reversed bias photodiode overlying a doped region of a substrate for accumulating photon-generated charge during the integration period.

The pixel 200 further contains a reset switch transistor 202 that is controlled by a reset clock 211 for resetting the photodiode 201 to a predefined voltage prior to integration. The drain of the reset transistor 202 is connected to a reset voltage supply (RST) 222, and upon application of the reset clock signal 211, it resets the photodiode high to the positive voltage RST minus the threshold of the reset transistor.

The pixel 200 may, but not necessarily, include an integration source-follower (ISF) transistor 203. The pixel 200 has a sample-and-hold switch transistor 204 that is the vehicle for transferring the integrated voltage signal from a collection region integration node 218 and providing corresponding voltage level to one capacitor plate of a sample-and-hold (SH) capacitor 206 via a storage node 217. The second plate of the sample-and-hold capacitor 206 is connected to ground. The sample-and-hold capacitor 206 is cleared via a clear switch transistor 205 and a clear signal 213 prior to closing the sample-and-hold switch 204 and transferring the photon-generated voltage to the sample and hold storage node 217. A sample-and-hold clock signal 212 is operable to open and close the SH switch 204. The pixel 200 further comprises a readout portion including a source-follower transistor (RSF) 208 having its gate connected to the storage node 217. The source of the readout source-follower transistor 208 is connected to the column output bus 210 via an output node 220. The drain of the readout source-follower transistor 208 is connected to a row select switch transistor 209 via an intermediate node 221. The row select transistor 209 is controlled by a readout select clock 214, and when the switch is closed, it enables the readout source-follower (RSF) transistor 208 to transfer the sampled voltage to the column output bus 210. The row select transistor 209 is controlled by the row select clock 214, and when the switch is closed, it enables the drain current to flow through the RSF transistor 208. Only then can the RSF transistor 208 drive the column output bus 210 from the low state (i.e., its prior clear state). A process supply voltage 215, such as VDD, is connected to the integration source-follower transistor 203 and the row select transistor 209.

The present invention in the embodiment depicted in FIG. 2 exposes the storage node 217 to the full effect of the gate-source (GS) capacitance ($C_{GS-RSF}$) 207 of the readout source-follower (RSF) transistor 208 since the row select switch transistor 209 is connected to its drain and not to its source. Once the select switch 209 is closed during the readout, the voltage on the storage node 217 is increased in proportion to the signal voltage stored on it during the sampling operation. Thus a gain is provided in the pixel 200 that compensates for voltage range loss and reduces non uniformity.

Figure 1:
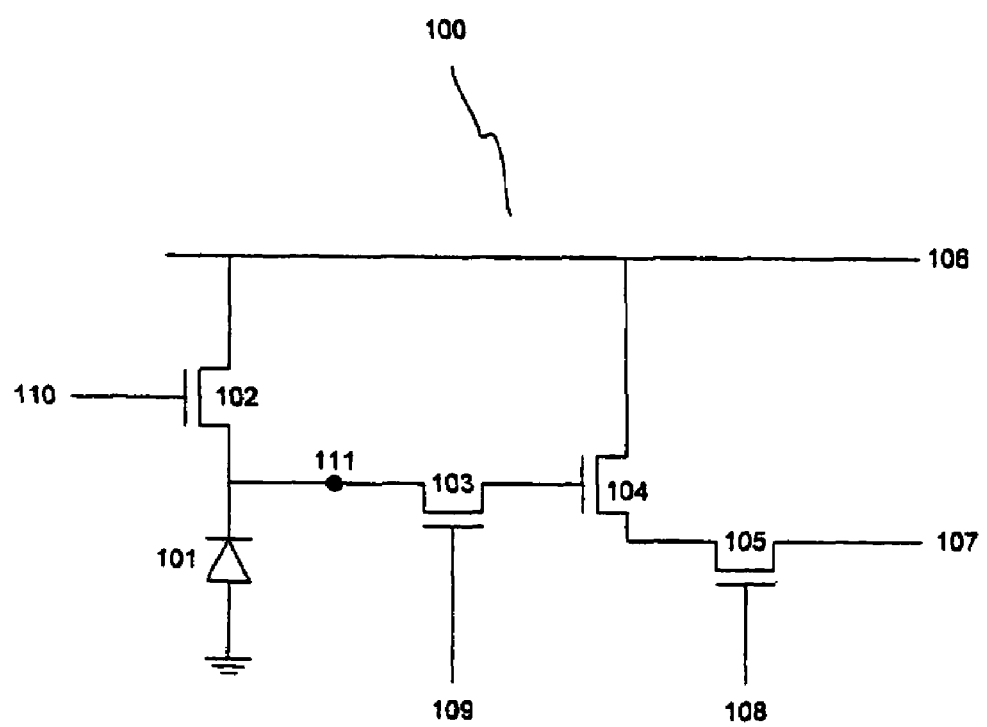
FIG. 1 depicts a conventional Active Pixel Sensor of 4T (4 Transistors) design.

In addition, the present invention in the embodiment depicted in FIG. 2 clears the output voltage on the output node 220 of pixel 200 prior to the readout of a new signal. Thus the architecture provided in pixel 200 further eliminates noise known as the "ghost image" problem that affects the conventional 4T design as depicted in FIG. 1.

Figure 3B:
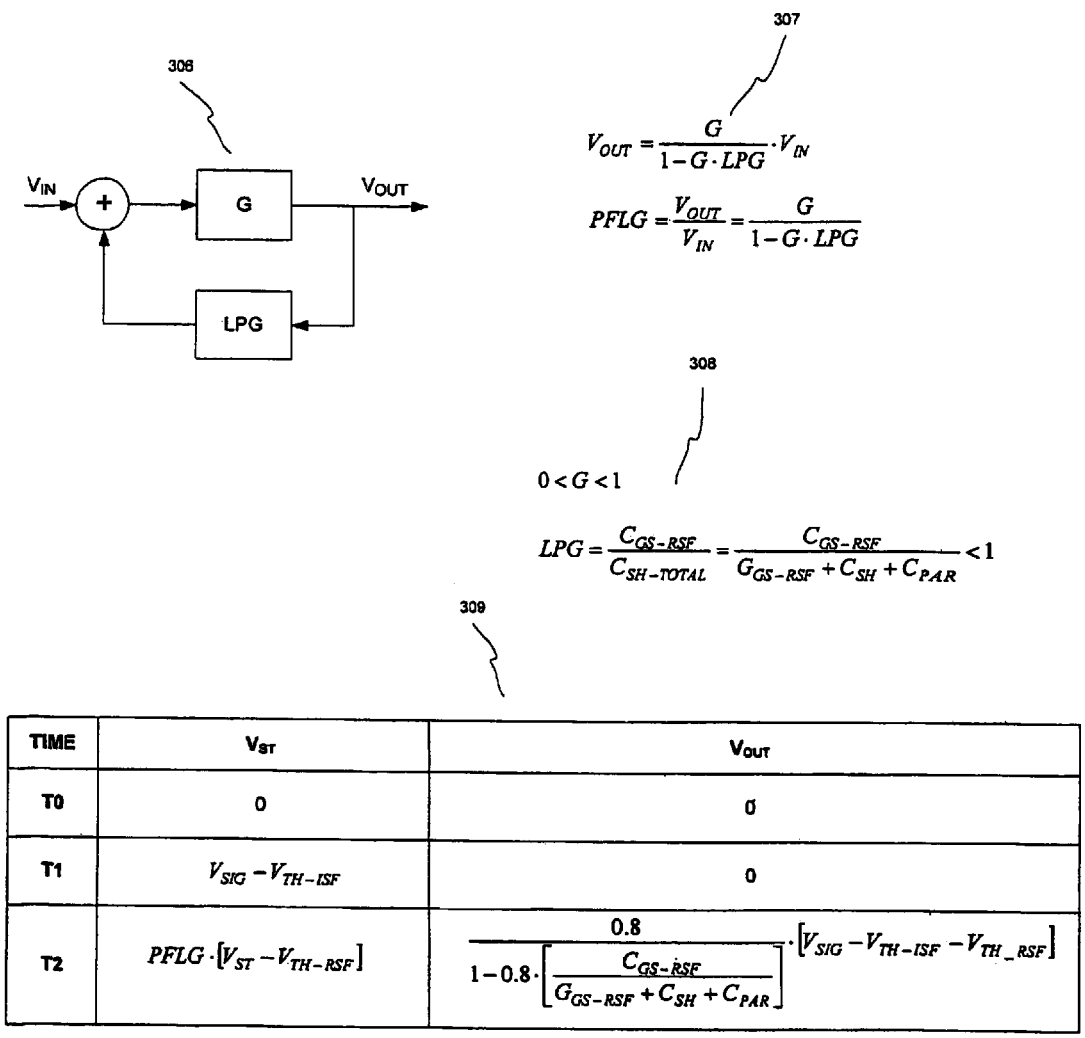
FIG. 3B illustrates Positive Feedback Loop gain introduced in the pixel depicted in FIG. 2 in accordance with one embodiment of the current invention.

FIG. 3A provides a partial timing and signal diagram for the operation of pixel 200 that demonstrates the gain in the pixel. The timing diagram 300 starts with time T0 (T zero), in which a high clear clock signal (CLR) 301 is applied to clear switch 205 to clear the sample-and-hold (SH) capacitor 206. Clearing of the sample-and-hold capacitor 206 happens after the pixel 200 finishes integration and the voltage corresponding to the photon-generated charge ($V_{SIG}$) has been transferred to the integration source follower (ISF) transistor 203 and is presented on an intermediate node 219 as described in FIG. 2. During the time that CLR 301 is high, the sample-and-hold switch 204 is open (a low sample-and-hold clock signal 302 applied to SH switch 204) and the voltage ($V_{ST}$) 304 on the storage node 217 is cleared to a predefined level, such as the lowest voltage supply level (typically ground), and at the same time the output node 220 is cleared as well. Once the sample-and-hold capacitor 206 is cleared, the clear switch 205 is opened (clock signal 301 goes low) and, at T1 (T one), the sample-and-hold clock signal 302 closes the sample-and-hold switch 204 and thus $V_{ST}$ 304 on the storage node 217 increases proportionally to the photon-generated charge by the photodiode. The voltage 304 $V_{ST}$ is reduced due to the threshold drop of the integration source follower transistor 203. At T2 (T two), the row select clock signal 303 closes the row select switch 209 thus enabling the drain current to flow through the RSF transistor 208 to the column output bus 210. The voltage 304 is increased proportionally due to the gate-source capacitance 207 effect, and the output voltage $V_{OUT}$ 305 follows in accordance as described in FIG. 3B on the output node 220.

FIG. 3B defines the gain introduced in the pixel 200 of FIG. 2. The increase in the signal voltage is a result of the Positive Feedback Loop introduced in the pixel 200. A reference diagram for a Positive Feedback Loop 306 is shown and those skilled in the art will know the Positive Feedback Loop Gain (PFLG) equation 307. FIG. 3B further provides exemplary gain values 308 for the Positive Feedback Loop Gain for the pixel 200. The Open Loop Gain G is the gain of the readout source-follower (RSF) transistor 208. This gain is always less than 1 (one) and greater than 0 (zero). A typical range for the gain of the source follower-transistor 208 is between 0.6 and 0.95. The value of 0.8 is chosen in 308 according to one embodiment. Equations 308 also provide the Loop Feedback Gain LPG for the pixel 200. LPG is equal to the gate-to-source (GS) capacitance $C_{GS\text{-}RSF}$ of the readout source-follower transistor 208 divided by the total capacitance $C_{SH\text{-}TOTAL}$ that the storage node 217 is exposed to. $C_{SH\text{-}TOTAL}$ is equal to the sum of the capacitance CSH of the sample-and-hold capacitor 206, the total parasitic capacitance CPAR, and the gate-to-source capacitance $C_{GS\text{-}RSF}$ of the readout source follower transistor 208. It is clear from equations 308 that the Loop Feedback Gain LPG is always less than 1 (one). Thus, the denominator of the Positive Feedback Loop Gain (PFLG) equation in 308 is never equal to 0 (zero) and therefore the Positive Feedback Loop as shown in 306 of pixel 200 is unconditionally stable.

FIG. 3B further provides in a table 309 values for the output voltage 305 $V_{OUT}$ on output node 220 for the time points T0, T1 and T2 as described in FIG. 3A. As explained in FIG. 3A, the output node 220 is cleared and during T0, no signal is present on the storage node 217, and the row select switch 209 is open. Thus, the voltage on the gate of the readout transistor 208 is below its threshold voltage $V_{TH\text{-}RSF}$ and hence $V_{OUT}$ is zero. During Ti, which is the sample-and-hold stage as described in FIG. 2A, the voltage $V_{ST}$ on the storage node 217 is increased proportionally to the integrated signal $V_{SIG}$ minus the integration source-follower transistor 203 threshold $V_{TH\text{-}ISF}$ and the row select switch 209 is still open. Therefore, $V_{OUT}$ is still zero. During T2, the readout stage as described in FIG. 3A, the sample-and-hold switch 204 is open and the row select switch 209 is closed. Thus, output node 220 voltage $V_{OUT}$ is the voltage $V_{ST}$ on the storage node 217 minus the readout source-follower transistor 208 threshold VTH-RSF amplified by the Feedback Loop Gain (PLFG) as described previously.

Figure 3C:
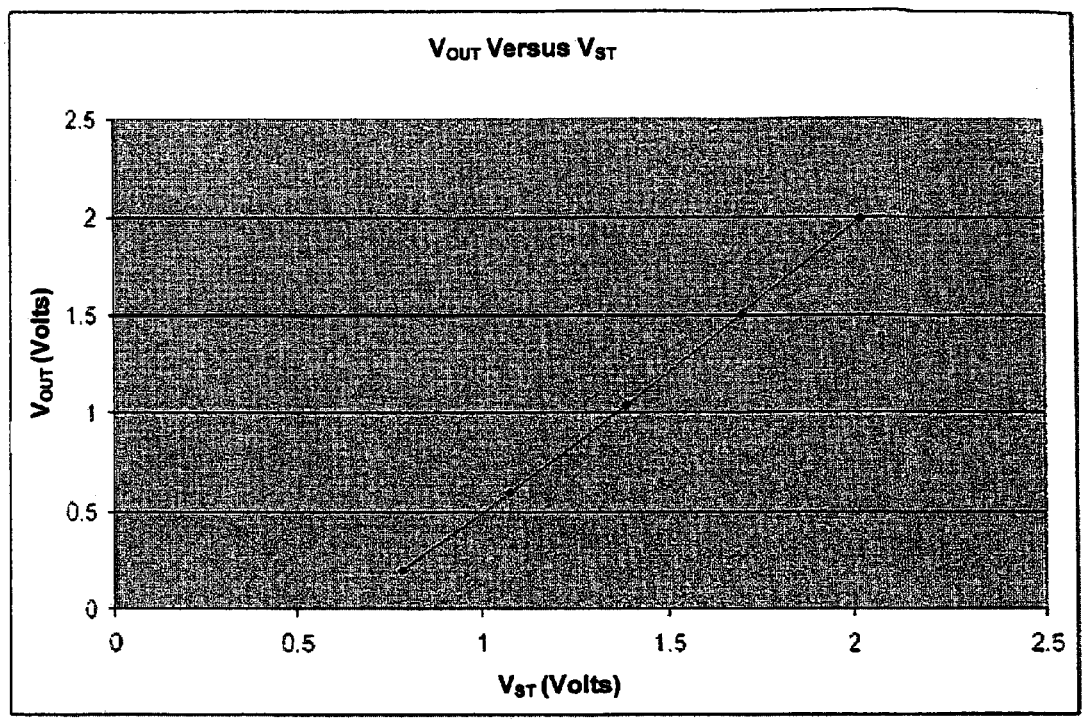
FIG. 3C is an output of a SPICE simulation of the pixel depicted in FIG. 2 showing the actual gain introduced.

FIG. 3C is an output of a SPICE simulation of the pixel 200 as depicted in FIG. 2. The capacitance values used for the simulation were approximately 3.75 FF (femtofarads) for the sample-and-hold capacitor 206 and for the gate-to-source (GS) capacitance of the readout source follower (RSF) transistor 208.

The gain of the readout source-follower (RSF) transistor 208 was chosen to be 0.88 and is an Open Loop Gain G as explained in FIG. 3B. The total parasitic capacitance CPAR was estimated to be 0.5 FF. Applying these values to the Positive Feedback Loop gain equation described in FIG. 3B, a gain of 1.49 is calculated for the Positive Feedback Loop FPLG of pixel 200.

FIG. 3C verifies the predicted gain of the Positive Feedback Loop (PLFG) of pixel 200. The PLFG gain is the slope of the line shown in FIG. 3C, and it is approximately 1.48, which is very close to the predicted value of 1.49. The gain graph in FIG. 3C also shows excellent linearity.

Figures 4A, 4B:
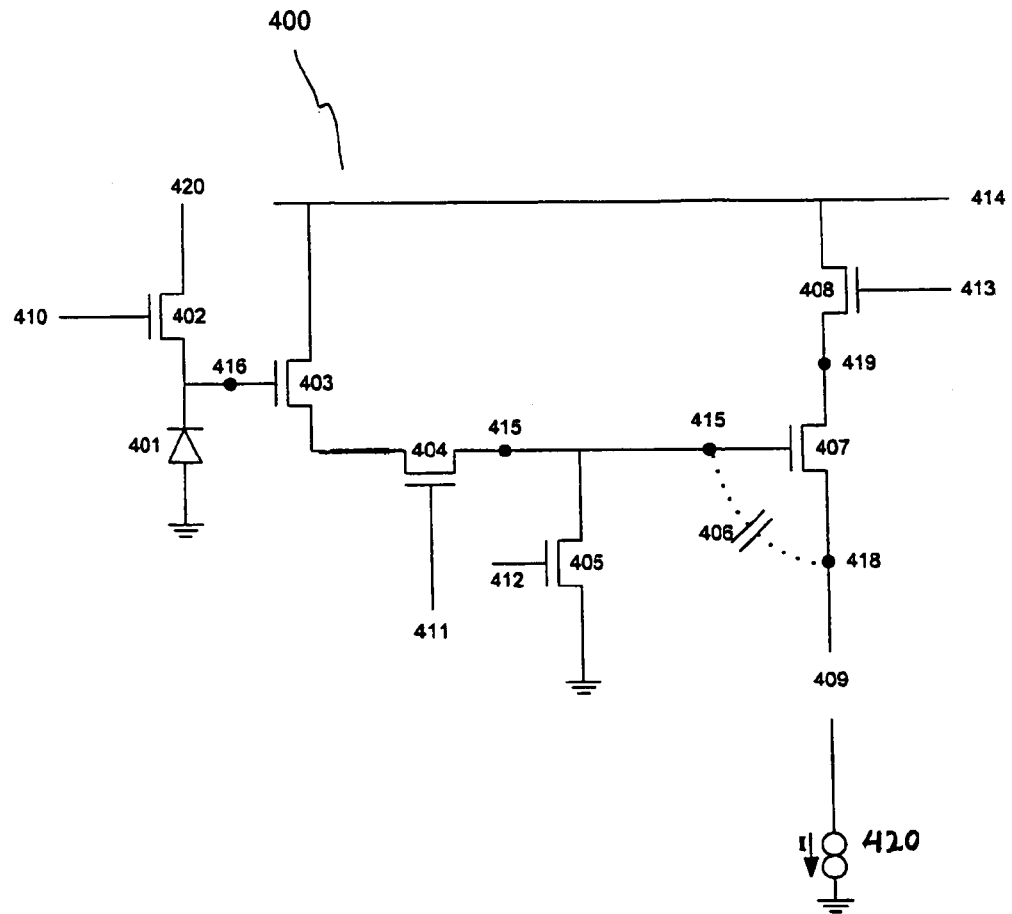
FIG. 4A is a schematic diagram of a portion of a CMOS active pixel sensor array that comprises of one active pixel sensor cell in accordance with another embodiment of the current invention.
FIG. 4B explains the current invention Positive Feedback Loop gain introduced in the pixel depicted in FIG. 4A in accordance with another embodiment of the current invention.

FIG. 4A is a schematic diagram of a portion of a CMOS active pixel sensor array that comprises an active pixel sensor cell 400 in accordance to another embodiment of the current invention. The cell 400 may be connected to additional cells contained in the array via a column output bus 409 having a current source 420 coupled to ground. The cell (or "pixel") 400 comprises a light sensing device 401 that is not limited to, but in this case is, a reversed bias photodiode overlying a doped region of a substrate for accumulating photon-generated charge during the integration period. The pixel 400 further contains a reset switch transistor 402 that is controlled by a reset clock 410 for resetting the photodiode 401 to a predefined charge prior to integration. The drain of the reset transistor 402 is connected to a reset voltage supply (RST) 420, and upon a reset clock signal 410, it resets the photodiode high to the positive voltage RST minus the threshold of the reset transistor. The pixel 400 may, but not necessarily, include an integration source follower (ISF) transistor 403. The pixel 400 has a sample-and-hold switch transistor 404 that is the vehicle for transferring the charge from the collection region via an integration node 416 and providing corresponding voltage level on a storage node 415. A sample-and-hold clock signal 411 is operable to open and close the SH switch 404.

The pixel 400 further comprises a readout portion including a source-follower (RSF) transistor 407 having its gate connected to the storage node 415. The gate-capacitance of the source-follower 407 is cleared via a clear switch transistor 404 prior to closing the sample-and-hold switch 404 and transferring the photon-generated charge. A clear switch 405 is controlled by a clear signal 412. The source of the readout source-follower transistor 407 is connected to the column output bus 409 via an output node 418. The drain of the readout source-follower transistor 407 is connected to a row select switch transistor 408 via an intermediate node 419. The row select transistor 408 is controlled by a readout select clock 413, and when the switch is closed, it enables the drain current to flow through the RSF transistor 407. Only then can the RSF transistor 407 drive the column output bus 409 from the low state (i.e. the prior clear state). A process supply voltage 414, such as VDD, is connected to the integration source-follower transistor 403 and the row select transistor 408.

The present invention in the embodiment depicted in FIG. 4A exposes the storage node 415 to the full effect of the gate-source (GS) capacitance $C_{GS\text{-}RSF}$ 406 of the readout source-follower transistor (RSF) 407 since the row select switch transistor 408 is connected to its drain and not to its source. Once the select switch 408 is closed during the readout, the voltage on the storage node 415 is increased in proportion to the signal voltage stored on it during the sampling operation. Thus a gain is provided in the pixel 400 that compensates for dynamic range loss and reduces non uniformity.

In addition, the present invention in the embodiment depicted in FIG. 4A clears the output voltage on the output node 418 of pixel 400 prior to the readout of a new signal. Thus, the architecture provided in pixel 400 further eliminates noise that is known as the "ghost image" problem that affects the conventional 4T design as depicted in FIG. 1.

The timing for pixel 400 is similar to the timing for pixel 200 as depicted in the timing diagram in FIG. 2A and will not be repeated here. FIG. 4B provides an equation for the gain of pixel 400 that amplifies the output voltage $V_{OUT}$ on the output node 418. The full explanation as given in FIG. 3B is applicable to the embodiment depicted in FIG. 4A and will not be repeated here. Those who are skilled in the art will realize that since there is no sample-and-hold (SH) capacitor in the second embodiment of FIG. 4A, the Loop Gain (LPG) of the Positive Feedback Loop of pixel 400 relies on the total parasitic (also referred to as stray) capacitance CPAR. Thus care must be taken to ensure that the gain has the appropriate value with respect to the expected input signal. When means to precisely control the parasitic capacitances in the CMOS process will be realized, this embodiment offers the advantage of having one less component in the pixel while providing essentially the same functionality as the other embodiment.

Having thus described embodiments of the present invention, persons of ordinary skill in the art will recognize that changes may be made in form and detail without departing from the scope of the invention. Thus the invention is limited only by the following claims.

What is claimed is:

1. A pixel cell for an imager, comprising:
a radiation sensor;
a reset switch coupled to the output of the radiation sensor;
a sample and hold switch coupled to the reset switch;
a clear switch coupled to the sample and hold switch; and
a cell readout portion coupled to the clear switch, the readout portion comprising:
a readout source-follower transistor coupled to the clear switch;
a row select transistor coupled between the source-follower transistor and a supply voltage; and
a column output line coupled to the source-follower transistor.

2. The pixel cell of claim 1, further comprising an integration source-follower transistor coupled between the output of the radiation sensor and the reset switch.

3. The pixel cell of claim 1, further comprising a sample and hold capacitor coupled between the clear switch and the readout source-follower transistor.

4. The pixel cell of claim 1, wherein the switches are transistors.

5. The pixel cell of claim 1, wherein the radiation sensor is a photodiode.

6. The pixel cell of claim 1, wherein the radiation sensor is a photogate.

7. The pixel cell of claim 1, wherein the radiation sensor is a Bi-Polar Junction transistor (BJT).

8. The pixel cell of claim 1, further comprising a reset clock coupled to and controlling the reset switch, a sample and hold clock coupled to and controlling the sample and hold switch, and a readout select clock coupled to and controlling the row select transistor.

9. The pixel cell of claim 1, further comprising a reset voltage supply coupled to the reset switch and a supply voltage coupled to the row select transistor.

10. The pixel cell of claim 2, further comprising a reset voltage supply coupled to the reset switch and a supply voltage coupled to the row select transistor and the integration source-follower transistor.

11. The pixel cell of claim 1, further comprising a ground coupled to the radiation sensor, the clear switch, and the column output line.

12. The pixel cell of claim 1, wherein the readout source-follower transistor has a gain between approximately 0 and 1.

13. The pixel cell of claim 1, wherein the readout source-follower transistor has a gain between approximately 0.6 and approximately 0.95.

14. A sensor array comprising:
a plurality of pixel cells, each pixel cell comprising:
a radiation sensor;
a reset switch coupled to the output of the radiation sensor;
a sample and hold switch coupled to the reset switch;
a clear switch coupled to the sample and hold switch; and
a cell readout portion coupled to the clear switch, the readout portion comprising:
a readout source-follower transistor coupled to the clear switch;
a row select transistor coupled between the source-follower transistor and a supply voltage; and
a column output line coupled to the source-follower transistor.

15. A method of operating a pixel cell in a sensor, the pixel cell having a radiation sensor coupled to a sample and hold switch, a clear switch coupled to the sample and hold switch, a row select switch coupled to the clear switch, a readout source-follower transistor coupled to the row select switch and having a gate coupled to the clear switch, and an output node coupled to the readout source-follower transistor, the method comprising:
clearing the voltage on the output node;
clearing the voltage on the gate of the readout source-follower transistor;
increasing the voltage on the gate of the readout source-follower transistor in proportion to a photon-generated charge by the radiation sensor; and
providing gain for increasing the voltage on the output node.

16. The method of claim 15, wherein the voltage increase on the output node is proportional to the voltage increase on the gate of the readout source-follower transistor, wherein the proportional gain factor is greater than 1.

17. The method of claim 15, wherein clearing the voltage on the output node comprises opening the row select switch, closing the clear switch, and opening the sample and hold switch.

18. The method of claim 15, wherein increasing the voltage on gate of the readout source-follower transistor comprises opening the clear switch, closing the sample and hold switch, and keeping the row select switch open.

19. The method of claim 15, wherein increasing the voltage on the output node comprises opening the sample and hold switch, closing the row select switch, and keeping the clear switch open.

20. The method of claim 13, wherein the radiation sensor is a photodiode.

21. The method of claim 15, wherein the radiation sensor is a photogate.

22. The method of claim 15, wherein the radiation sensor is a Bi-Polar Junction transistor (BJT).

23. The method of claim 18, wherein opening the clear switch is prior to closing the sample and hold switch.

24. The method of claim 19, wherein opening the sample and hold switch is prior to closing the row select switch.

25. The method of claim 15, wherein the switches are transistors.

26. A method of operating a pixel cell in a sensor, the pixel cell having a radiation sensor coupled to a sample and hold switch, a clear switch coupled to the sample and hold switch, a row select switch coupled to the clear switch, a readout source-follower transistor coupled to the row select switch and having a gate coupled to the clear switch, and an output node coupled to the readout source-follower transistor, the method comprising:

clearing the voltage on the output node;

clearing the voltage on the gate of the readout source-follower transistor;

increasing the voltage on the gate of the readout source-follower transistor in proportion to a photon-generated charge by the radiation sensor;

increasing the voltage on the output node; and providing a gain greater than one to increase the voltage on the output node.

* * * * *

UNITED STATES PATENT AND TRADEMARK OFFICE
CERTIFICATE OF CORRECTION

PATENT NO. : 7,411,168 B2
APPLICATION NO. : 11/311211
DATED : August 12, 2008
INVENTOR(S) : Kim Loren Johnson, Eugene Atlas and Sarit Neter It is certified that error appears in the above-identified patent and that said Letters Patent is hereby corrected as shown below:

Title page, Item (73) Assignee:

Delete "Imagerlaes, Inc., Monrovia, CA (US)" and
Insert --Imagerlabs, Inc., Monrovia, CA (US)--

Signed and Sealed this
Tenth Day of May, 2011

David J. Kappos
*Director of the United States Patent and Trademark Office*